United States Patent [19]

Kloucek et al.

[11] Patent Number: 4,875,613

[45] Date of Patent: Oct. 24, 1989

[54] APPARATUS FOR MANUFACTURING A LAMINAR BOND

[75] Inventors: Franz Kloucek, Wettingen; Per-Olof Larsson, Nussbaumen; Ernst Vogt, Remigen, all of Switzerland

[73] Assignee: BBC Brown Boveri AG, Baden, Switzerland

[21] Appl. No.: 324,016

[22] Filed: Mar. 16, 1989

Related U.S. Application Data

[62] Division of Ser. No. 168,396, Mar. 15, 1988, Pat. No. 4,832,253.

[30] Foreign Application Priority Data

Apr. 3, 1987 [CH] Switzerland ............... 1287/87

[51] Int. Cl.[4] .............................................. B23K 37/04
[52] U.S. Cl. .................................... 228/44.3; 29/238
[58] Field of Search ............... 228/44.3, 123; 269/287; 29/238, 446

[56] References Cited

U.S. PATENT DOCUMENTS

| 2,960,419 | 11/1960 | Emeis | 228/123 X |
| 3,220,091 | 11/1965 | Reef | 29/446 |
| 3,447,236 | 6/1969 | Hatcher | 228/123 X |
| 3,600,144 | 8/1971 | Csakvary | 228/123 X |
| 3,794,541 | 2/1974 | Schissler | 29/446 |
| 4,236,661 | 12/1980 | Dunn et al. | 228/212 X |
| 4,271,577 | 6/1981 | Kosugi | 29/238 |
| 4,607,779 | 8/1986 | Burns | 228/212 X |

FOREIGN PATENT DOCUMENTS

| 135120 | 9/1984 | European Pat. Off. |  |
| 2487577 | 1/1982 | France. |  |
| 257969 | 12/1985 | Japan | 228/263.12 |

OTHER PUBLICATIONS

*Brazing Manual* American Welding Society, Inc. Miami, Fla. 1976 pp. 123–239.

Wittmer et al *Journal American Ceramic Soc.*, vol. 65, No. 3, Mar. 1982, pp. 149–153.

*Primary Examiner*—Kenneth J. Ramsey
*Attorney, Agent, or Firm*—Oblon, Spivak, McClelland, Maier & Neustadt

[57] ABSTRACT

In a method for the firm bonding at elevated temperatures of thin, large-area wafers of different thermal expansion the deformations of the laminar bond occurring later during cooling are at least partially compensated by an appropriate pre-deformation in the opposite direction. An apparatus for conducting the method uses the different thermal expansion of a housing (1) and a ring-shaped thermal expansion element (3) to produce the pre-deformation.

2 Claims, 1 Drawing Sheet

APPARATUS FOR MANUFACTURING A LAMINAR BOND

This is a division of application Ser. No. 07/168,396, filed Mar. 15, 1988, now U.S. Pat. No. 4,832,253.

DESCRIPTION

1. Field of the Invention

The invention relates to the field of bonding technology. It pertains in particular to a method for manufacturing a laminar bond from at least two thin wafers of different thermal expansion, in which method the wafers are firmly bonded at elevated temperatures over the whole wafer area and subsequently cooled, and to an apparatus for conducting the method.

2. Prior Art

The firm bonding of thin, large-area wafers with different thermal expansion is a technique of great importance in various fields of application.

One of these fields of application is the manufacture of power semiconductor components in which for example a decisive role is played by large-area metal-ceramic bonds ($Cu-Al_2O_3$) or semiconductor-metal bonds ($Si-Mo$).

If for such a firm bonding a bonding process is used during which temperatures are highly elevated (e.g. the so-called direct bonding), then, because of the different thermal expansion coefficients mechanical stresses are set up in the firmly connected laminar bond during cooling and lead to a deformation of the laminar bond (see e.g. M. Wittmer et al. in J. Am. Ceramic Soc., Vol. 65, No. 3, p. 149–153).

On the one hand, the deformation exposes the parts of the laminar bond to undesired mechanical loading. On the other hand, as a deviation from flatness the deformation is greatly disadvantageous for the further treatment of the laminar bond (e.g. integration or subsequent mask processes).

For these reasons it has long been attempted to manufacture such a laminar bond free of deformation. One possibility for this is known for example from EP-A1 0,135,120.

In the case mentioned, which concerns a ceramic-metal laminar bond, the deformation of the large-area bond is prevented in that the metal layer is composed in a mosaic-like way of small-area, loosely adjoining metal elements, and so thermally determined stresses are absorbed.

However, this known solution does not provide sufficient stability for many purposes, because the mosaic-like composed layer contributes only a little to the strength of the laminar bond. Moreover, there are greater difficulties in bonding a layer consisting of nothing but individual elements with a monolithic layer than in bonding two monolithic layers.

SUMMARY OF THE INVENTION

It is the object of the present invention to specify a method for manufacturing a laminar bond and also an apparatus for conducting the method, with which it is possible to make from conventional wafers a laminar bond having a reduced deformation or none at all.

The object is achieved in a process of the type mentioned at the beginning, when the deformation of the laminar bond occurring during cooling is at least partially compensated by a pre-deformation applied in the opposite direction during the bonding process.

It follows that the core of the invention consists in subjecting the laminar bond to such a strong pre-deformation in the opposite direction at the elevated temperatures at which the process of firm bonding is carried out and at which no thermally-determined deformation yet occurs that the deformation occurring during the cooling and the pre-deformation at least partially compensate one another.

A particular advantage of the method according to the invention is to be seen in the fact that because of the compensation the laminar bond is largely free of stress at least in the inner region. Only in a narrow edge region do shear stresses remain, which according to a preferred further development of the invention can be removed by separating the edge region.

In order to produce the pre-deformation, it is particularly advantageous to have recourse to the different thermal expansion of two materials with different thermal expansion coefficients. In this way it is possible to produce a pre-deformation which increases with increasing temperature, without the laminar bond being subjected to additional mechanical strain (e.g. by the turning motion of a screw). This advantage becomes particularly important when one of the layers of the laminar bond is a sensitive semiconductor substrate.

The apparatus according to the invention for conducting the method comprises
- an essentially ring-shaped housing of a material of low thermal expansion;
- a ring-shaped thermal expansion element of a material of higher thermal expansion mounted concentrically in the housing support, which the wafer arrangement on one side at the wafer edge; and
- a screw closure located opposite the thermal expansion element, which presses against the wafer arrangement supported by the thermal expansion element with a pressure nose mounted in its interior.

Further illustrative embodiments follow from the subclaims.

BRIEF DESCRIPTION OF THE DRAWINGS

The invention will now be more closely explained in the following with the help of illustrative embodiments in conjunction with the diagram, in which.

DETAILED DESCRIPTION

Figure 1:
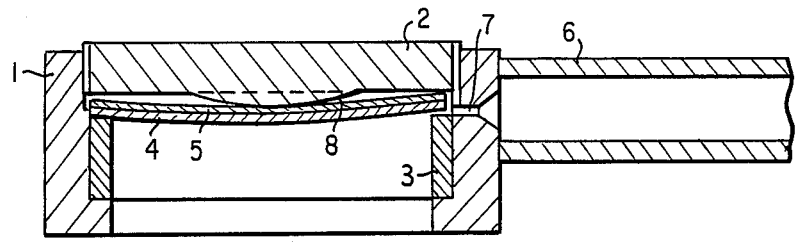
FIG. 1 shows a preferred illustrative embodiment for an apparatus for conducting the method according to the invention.

The method according to the invention and the corresponding apparatus for conducting the method are explained in the following with the examples of a laminar bond of an Si-semiconductor substrate and an Mo-metal substrate. Such a laminar bond is known under the name of "Alloy contact" from the technology of power semiconductor components.

In the manufacture of an alloy contact the large-area, thin semiconductor substrate of Si is firmly bonded with a metal substrate of the same size using aluminium as solder. Because of the thermally conditioned stresses only metals with a low thermal expansion such as Mo or W come into question for the metal substrate. Since the manufacturing temperatures for this contact are far above 400° C. (the eutectic temperature of the eutectic Al-Si-alloy participating in the firm bonding amounts to 577° C.), the contact can be regarded as a brazed joint. Most commonly applied as solder for the alloy contact is pure Al, which during the bonding process dissolves some Si of the semiconductor substrate and thus forms the already-mentioned Al-Si-alloy as contact layer.

If the semiconductor substrate is a thyristor that can be turned off via the gate (GTO=Gate Turn Off), then, among other things, the following problem arises: the alloying process, which leads to the alloy contact, takes place at such high temperatures that the last steps in the manufacture for the cathode side of the GTO-thyristor must be carried out after the alloying.

However, the alloyed laminar bond of Si-semiconductor substrate and Mo-metal substrate undergoes deformation during cooling after the alloying process because of the different thermal expansion coefficients of Mo ($\alpha = 5 \cdot 10^{-6} K^{-1}$) and Si ($\alpha = 2.6 \cdot 10^{-6} K^{-1}$). This deformation, which can amount to several 100 μm depending on wafer diameter and thickness, complicates the last manufacturing steps for a GTO-thyristor under the mask aligner and should therefore be kept as small as possible, in particular, however, smaller than about 50 μm. In this, the measure for the deformation is taken as the deviation (s) between the centre of the area of the laminar bond and the plane through its edge.

For different wafer diameters (38 and 77 mm) and various thicknesses of the Mo-metal substrate (1; 2 and 2.5 mm) the deformations have been both calculated by computer using a simplified elastic computation and also measured on manufactured alloy contacts. In this, the thickness of the semiconductor substrates was of the order of 0.5 mm. Again, the calculation was done on the assumption of cooling from an effective temperature of 400° C.

For purposes of comparison, the results of the computation and measurement are represented in the following table 1:

TABLE 1

| Wafer φ | Thickness Mo-substrate | s(computation) | s(measurement) |
|---|---|---|---|
| 77 | 2.5 | 211 | 200 |
| 38 | 1 | 133 | 135 |
| 38 | 2 | 59 | 50 |
| (mm) | (mm) | (μm) | (μm) |

There is an adequate agreement between the computed and the experimental results for the deformation s, when the calculation is done on the assumption mentioned above that the laminar bond was cooled to room temperature from an effective temperature of 400° C. By contrast, an assumed cooling from the eutectic temperature of 577° C. would return over-high values. This approach is justified in that the computer programme assumes a rigid coupling of the semiconductor and metal substrates, whereas in reality below 577° C. even small mechanical stresses suffice to produce drastic deformation through creeping in the Al-Si-solder. Again, the stress values arising in the interior of the laminar bond have a realistic order of magnitude under the first-named assumption.

The deformation measured in the third case shown in Table 1 (s=50 μm) lies exactly on the limit of the previously quoted target value for the sensible use of a mask aligner.

However, thinner Mo-metal substrates (thickness less than 2 mm) would mean a larger deformation and could therefore not be used.

According to the computation, in the first case of Table 1 a Mo-metal substrate with a thickness of 6.5 mm would be required, in order to reduce the deformation from the measured value of 200 μm to a tolerable level.

In each case, however, relatively thick Mo-metal substrates have a range of disadvantages for the thyristor:

high heat conduction resistance when operating the thyristor;

high costs of thick Mo-metal substrates; and conditions for the manufacture of the alloy contact which are made difficult by the greater thermal mass.

According to the invention the deformation will not now be absorbed through the choice of an adequately thick metal substrate, but (for thicknesses of the metal substrate <5 mm, preferably <2.5 mm) through applying at the elevated alloy temperatures a pre-deformation which takes place in the opposite direction.

The preferred illustrative embodiment of an apparatus with which this pre-deformation can be produced simply and reliably in a small area and with excellent thermal flux conditions (for an undisturbed alloying process) is represented in FIG. 1.

The compact load apparatus shown there consists of an essentially ring-shaped housing 1 with a tubular holder 6 fitted at the side.

The housing 1 is open at the bottom, and its lower part has an internal ledge carrying a ring-shaped thermal expansion element 3 mounted concentrically in the housing 1.

Cut into the upper part of the housing 1 is an internal thread belonging to a screw closure 2, which resembles a lid and closes the housing 1 on the upper side.

Between the thermal expansion element 3 and the screw closure 2 is mounted the arrangement of metal substrate 4 (Mo-wafer) and semiconductor substrate 5 (Si-wafer), which are to be firmly bonded into a laminar bond by alloying. The dimensions of the housing 1, the thermal expansion element 3 and the wafers (4, 5) to be bonded are coordinated in such a way that the wafers rest with their edges on the thermal expansion element 3 and then are supported on one side at their edges.

A pressure nose 8 in the form of a spherical segment is mounted on the inside of the screw closure 2. When the screw closure 2 is screwed sufficiently far into the housing 1, the pressure nose 8 exerts a punctiform load on the middle of the wafer arrangement, which deflects the wafers downwards.

Since in the presentation chosen in FIG. 1 the metal substrate 4 in the form of a Mo-wafer having a thermal expansion coefficient twice as high as that of Si is located underneath the semiconductor substrate 5, the deformation occurring during cooling after the alloying would deflect the laminar bond upwards. The pre-deformation caused by the screw closure 2 and the thermal expansion element 3 is therefore exactly opposed to the thermally determined deformation.

However, the application of a load sufficient for the predeformation occurs not by virtue of the tightening of the screw closure 2, but by virtue of the different expansions of the thermal expansion element 3 and housing 1 when the arrangement is warmed up to the temperatures necessary for the alloying process.

In order to achieve this, the housing 1 is made from a material with a lower thermal expansion, and the thermal expansion element 3 from a material with a higher thermal expansion. Many pairs of materials come into consideration for this purpose. In practice, success has been achieved by specially manufacturing the housing 1 from a molybdenum base alloy, which is sold under the name of "Climelt TZM" by the US firm Climax Molybdenum Co. of Michigan and for a minimum content of over 99% Mo has a thermal expansion coefficient of $\alpha = 4.8 \cdot 10^{-6} K^{-1}$ at 700° C. (specification sheet CMX-TZM-DG-1), and also a thermal conductivity well suited for the alloying process.

Concerning the material used to manufacture the thermal expansion element 3 success has been achieved with a nickel base alloy Ni50CoMoAl, which is commercially available under the name of "Nimonic 105", and has a thermal expansion coefficient of $\alpha = 13.4 \cdot 10^{-6} K^{-1}$ at 400° C.

During production of the alloy contact the wafer arrangement rests on the thermal expansion element 3 and is only slightly preloaded by the pressure nose 8 of the screw closure 2. During the heating-up process the thermal expansion element 3 then expands more than the housing 1 and deforms the wafers lying in between. In this, the deformation s as computed from the temperature change ... T, the height h of the thermal expansion element 3 and the difference of the thermal expansion coefficients of the thermal expansion element 3 ($\alpha_T$) and the housing 1 ($\alpha_H$) is:

$$s = h \cdot \ldots T(\alpha_T - \alpha_H)$$

Although it is also possible to realize the pre-deformation of the wafers purely mechanically with the screw closure, the thermally induced loading by means of the thermal expansion element is particularly advantageous precisely during the manufacture of Si-Mo-alloy contacts: the sensitive semiconductor substrate is not additionally loaded by a frictional rotation of the screw closure. Moreover, after the alloying process the apparatus can be easily opened.

Using an apparatus according to FIG. 1, which was prepared from the materials mentioned above, alloy contacts with pre-deformation were manufactured in a vacuum furnace between two panel heating elements, and then measured. For wafers (Si and Mo) with a diameter of 38 mm and a thickness of the Mo-metal substrate of 1 mm a deformation of $s = 90$ μm occurred after pre-deformation, instead of the original deformation of $s = 135$ μm (case 2 in Table 1). In this, the desired upper limit of $s = 50$ μm was exceeded purely because in this configuration reasons of space limited the maximum deformation obtainable with the thermal expansion element to 45 μm.

With a slight additional pre-deformation by tightening the screw closure it was possible, therefore, to reduce the deformation by a further 10 μm to $s = 80$ μm.

Figure 3:
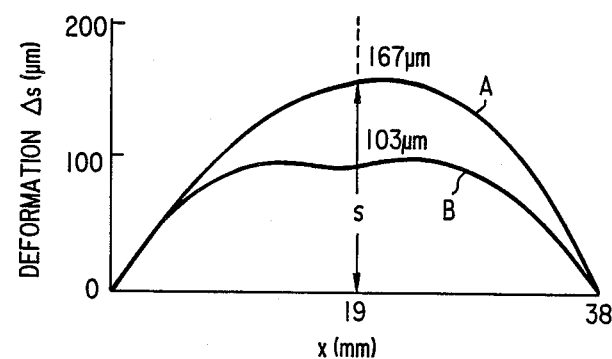
FIG. 3 shows, for comparison, the measured curvature of a laminar bond without pre-deformation (curve A) and with pre-deformation (curve B).

The deformation profile, i.e. the change ... s in the deformation along the wafer diameter (coordinate x), as measured in the given cases, is shown in FIG. 3. Curve A represents the deformation profile for the laminar bond (wafer diameter: 38 mm; thickness Mo-wafer: 1 mm) without pre-deformation, curve B the deformation profile with the pre-deformation due to the thermal expansion element 3 and the screw closure 2.

The fact that the absolute values of 167 and 103 μm occurring in this connection for the deformation s in the middle of the wafer ($x = 19$ mm) do not coincide with the values of 135 and 80 μm given above, is to be ascribed to the different measuring methods used in the two cases.

As can be seen from curve B, the pre-deformed laminar bond has an area of convex curvature in the middle of the wafer. Such a convex curvature indicates that there is a switch in the signs of the stress distributions in Si- and Mo-wafers. This leads to tensile stresses in the Si-wafer, which are to be avoided as far as possible.

The convex curvature is a direct consequence of the punctiform load produced in the middle of the wafer by the pressure nose 8 in FIG. 1 (diagrammatic representation in FIG. 2A), for which the bending moment M, applied along the wafer diameter, has a punctiform maximum in the middle of the wafer.

Figures 2A, 2B:
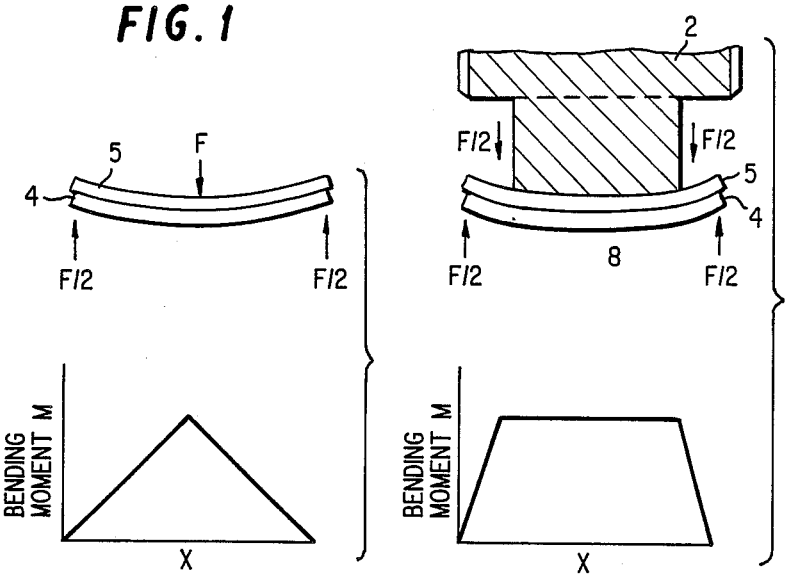
FIG. 2A shows the load set-up and the bending moment diagram for a punctiform load of the wafer arrangement at pre-deformation.
FIG. 2B shows the load set-up and the bending moment diagram for a correspondingly ring-shaped load with constant bending moment in the inner region.

As a suitable measure for avoiding the convex curvature it is possible to replace the punctiform load in the middle of the wafer with a ring-shaped load in the form of a constant bending moment M in the wafer area under load. Seen in cross-section through the wafer this is a four-point load (FIG. 2B).

This ring-shaped load can be realized with a pressure nose 8 (FIG. 2B), which rises cylindrically from the surface of the screw closure 2 and ends in a spherical segment having the radius of curvature of the pre-deformed wafers. The radius of the cylinder then determines the partial area with constant bending moment M.

It follows from what has been said that with the method according to the invention it is possible to manufacture laminar bonds, and in particular power semiconductor components provided with alloy contacts, which exhibit at least a reduced deformation after the alloying. This does not mean, however, that the laminar bond is necessarily free of stress.

It has emerged from detailed computer analyses of the stresses that application of the pre-deformation does not simply redistribute the stresses within the laminar bond, but reduces them at most by a factor of more than 3. Given complete compensation of the deformation by an appropriate pre-deformation with constant bending moment M, the alloyed laminar bond is not only flat at room temperature but also free of stress.

However, this does not apply at the wafer edge, where shear stresses chiefly occur. These shear stresses can preferably be eliminated by removing (e.g. by sawing, grinding or sand blasting) a narrow border of the laminar bond, in particular of a width corresponding to three times the thickness of the laminar bond. When removing the border it is possible at the same time to give the semiconductor substrate an appropriate edge contour, as is normal for improving the locking capability.

The compact design of the apparatus according to FIG. 1, together with its low thermal mass and good accessibility for thermal radiation make this apparatus seem particularly suitable for use in an alloying oven, in which the elevated temperatures for the firm bonding are produced purely by radiation interchange in a vacuum between two large-area panel heating elements, particularly in the form of current-carrying graphite sheets.

During this process appropriate temperature measurement can be provided for with a thermometer bore 7 (FIG. 1) in the housing 1, through which a thermal couple, for example, is introduced into the interior.

Finally, it ought also to be mentioned that in accordance with the experience to date loading of the wafer arrangement during pre-deformation causes a reduction in the amounts of solder required for a firm bonding of the wafers. In the case of the Si-Mo-bonding with Al-solder the consequence would be that less Si would be dissolved in the solder and the melting zone could no longer penetrate so deeply into the semiconductor substrate and endanger flat p-n junctions there.

Altogether, the invention makes available a method and an apparatus having the following advantages:

the apparatus is simply designed and requires little space;

the pre-deformation technique can be fitted without any problem into special alloying processes (panel heating elements!);

for Si-Mo-bonding the amount of Al-solder can be reduced (protection of flat p-n junctions);

higher reliability of power semiconductor components with alloy contacts during operation due to reduced mechanical stresses;

alloy contacts possible for even larger components of more than 3" diameter;

use of thin and low-price metal substrates (Mo) possible;

problem-free use of mask processes after the alloying (with the GTO-thyristor); and application of the alloying technique also for very finely structured components, for which no deformation can be tolerated during the last steps in manufacture.

What is claimed is:

1. Apparatus for bonding two wafer members having different coefficients of thermal expansion comprising
   (a) an essentially ring-shaped housing (1) of a material of low thermal expansion;
   (b) said housing supporting at a first end a ring-shaped thermal expansion element (3) of a material of higher thermal expansion mounted concentrically in the housing (1), which supports the wafer arrangement on one side at the wafer edge; and
   (c) said housing threadedly supporting at its other end a screw closure (2) located opposite the thermal expansion element (3), which presses against the wafer arrangement supported on the thermal expansion element (3) with a central pressure nose (8) mounted in its interior.

2. Apparatus according to claim 1, characterized in that
   (a) the housing (1) consists of a molybdenum base alloy and
   (b) the thermal expansion element (3) consists of a nickel base alloy; and
   (c) the pressure nose (8) has a pressure area in the form of a spherical segment.

* * * * *